(12) United States Patent
Hill et al.

(10) Patent No.: US 6,933,558 B2
(45) Date of Patent: Aug. 23, 2005

(54) FLASH MEMORY DEVICE

(75) Inventors: Wiley Eugene Hill, Moss Beach, CA (US); Haihong Wang, Milpitas, CA (US); Yider Wu, Campbell, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/726,508

(22) Filed: Dec. 4, 2003

(65) Prior Publication Data

US 2005/0121716 A1   Jun. 9, 2005

(51) Int. Cl.$^7$ ............................................. H01L 29/792
(52) U.S. Cl. ...................................... 257/324; 257/329
(58) Field of Search ................................. 257/324, 329

(56) References Cited

U.S. PATENT DOCUMENTS

| | | | |
|---|---|---|---|
| 5,379,255 A | 1/1995 | Shah ........................... | 365/185 |
| 5,382,540 A | 1/1995 | Sharma et al. ................. | 437/52 |
| 5,959,328 A | 9/1999 | Krautschneider et al. ... | 257/314 |
| 5,973,356 A | 10/1999 | Noble et al. ................. | 257/319 |
| 6,207,515 B1 * | 3/2001 | Hsieh et al. ................. | 438/300 |
| 6,440,801 B1 | 8/2002 | Furukawa et al. .......... | 438/272 |
| 6,551,880 B1 * | 4/2003 | Lai et al. ..................... | 438/261 |
| 6,580,124 B1 * | 6/2003 | Cleeves et al. ............. | 257/331 |
| 6,727,544 B2 * | 4/2004 | Endoh et al. ................ | 257/315 |
| 6,768,158 B2 | 7/2004 | Lee et al. ..................... | 257/315 |
| 6,768,166 B2 * | 7/2004 | Hagemeyer .................. | 257/324 |
| 2002/0028541 A1 * | 3/2002 | Lee et al. ..................... | 438/149 |
| 2003/0235075 A1 * | 12/2003 | Forbes ........................ | 365/177 |
| 2004/0235300 A1 | 11/2004 | Mathew et al. ............. | 438/689 |

FOREIGN PATENT DOCUMENTS

DE       10220923 A1     11/2003

OTHER PUBLICATIONS

Digh Hisamoto et al., "FinFET-A Self-Aligned Double-Gate MOSFET Scalable to 20 nm," IEEE Transactions on Electron Devices, vol. 47, No. 12, Dec. 2000, pp. 2320-2325.
Yang-Kyu Choi et al., "Sub-20nm CMOS FinFET Technologies," 2001 IEEE, IEDM, pp. 421-424.
Xuejue Huang et al., "SUb-50 nm P-Channel FinFET," IEEE Transactions on Electron Devices, vol. 48, No. 5, May 2001, pp. 880-886.
Xuejue Huang et al., "Sub 50-nm FinFET: PMOS," 1999 IEEE, IEDM, pp. 67-70.
Yang-Kyu Choi et al., "Nanoscale CMOS Spacer FinFET for the Terabit Era," IEEE Electron Device Letters, vol. 23, No. 1, Jan. 2002, pp. 25-27.
Copy of co-pending U.S. Appl. No. 10/459,576; by Yider Wu et al., filed Jun. 12, 2003 entitled: "Non-Volatile Memory Device," 20 page specification, 11 sheets of drawings.

* cited by examiner

*Primary Examiner*—Dung Le
*Assistant Examiner*—Tu-Tu Ho
(74) *Attorney, Agent, or Firm*—Harrity & Snyder, LLP

(57) ABSTRACT

A memory device includes a conductive structure, a number of dielectric layers and a control gate. The dielectric layers are formed around the conductive structure and the control gate is formed over the dielectric layers. A portion of the conductive structure functions as a drain region for the memory device and at least one of the dielectric layers functions as a charge storage structure for the memory device. The dielectric layers may include oxide-nitride-oxide layers.

20 Claims, 10 Drawing Sheets

FLASH MEMORY DEVICE

TECHNICAL FIELD

The present invention relates to memory devices and methods of manufacturing memory devices. The present invention has particular applicability to non-volatile memory devices.

BACKGROUND ART

The escalating demands for high density and performance associated with non-volatile memory devices require small design features, high reliability and increased manufacturing throughput. The reduction of design features, however, challenges the limitations of conventional methodology. For example, the reduction of design features makes it difficult for the memory device to meet its expected data retention requirement, e.g., a ten year data retention requirement.

DISCLOSURE OF THE INVENTION

Implementations consistent with the present invention provide a non-volatile memory device formed using pillar structures. Oxide-nitride-oxide (ONO) layers may be formed around the pillar structures and a polysilicon or metal layer may be formed over the ONO layers. The nitride layer in the ONO layers may act as the charge storage or floating gate electrode for the non-volatile memory device. The polysilicon or metal layer may function as the control gate for the non-volatile memory device and may be separated from the floating gate by the top oxide layer of the ONO layers.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to the present invention, the foregoing and other advantages are achieved in part by a memory device that includes a first conductive layer, a conductive structure, a number of dielectric layers and a control gate. The conductive structure is formed on the first conductive layer and a portion of the first conductive layer acts as a source region for the memory device. The conductive structure has a first end and a second end opposite the first end. The first end is disposed adjacent the portion of the first conductive layer that acts as the source region and the second end acts as a drain region for the memory device. The dielectric layers are formed around at least a portion of the conductive structure and at least one of the dielectric layers acts as a floating gate electrode for the memory device. The control gate is formed over the dielectric layers.

According to another aspect of the invention, a memory device that includes a substrate, a first insulating layer, a conductive structure, a number of dielectric layers and a control gate is provided. The first insulating layer is formed on the substrate and a conductive structure is formed over the first insulating layer. The conductive structure functions as a channel region for the memory device. The dielectric layers are formed around at least a portion of the conductive structure and at least one of the dielectric layers functions as a charge storage electrode for the memory device. The control gate is formed over the dielectric layers.

According to another aspect of the invention, a non-volatile memory array that includes a first conductive layer, a number of structures, a number of dielectric layers and at least one conductive layer is provided. The first conductive layer is formed on a substrate and portions of the first conductive layer act as source regions for memory cells in the memory array. The structures are formed on the first conductive layer and each of the structures functions as a channel region for one of the memory cells. The dielectric layers are formed around portions of each of the structures, wherein at least one of the dielectric layers functions as a charge storage electrode for one of the memory cells. The at least one conductive layer is formed over the plurality of dielectric layers for each of the memory cells.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide non-volatile memory devices, such as flash electrically erasable read only memory (EEPROM) devices, and methods of manufacturing such devices. The memory device may include a pillar structure with dielectric layers and a control gate layer formed around the pillar structure. One or more of the dielectric layers may act as a floating gate for the memory device.

Figure 1:
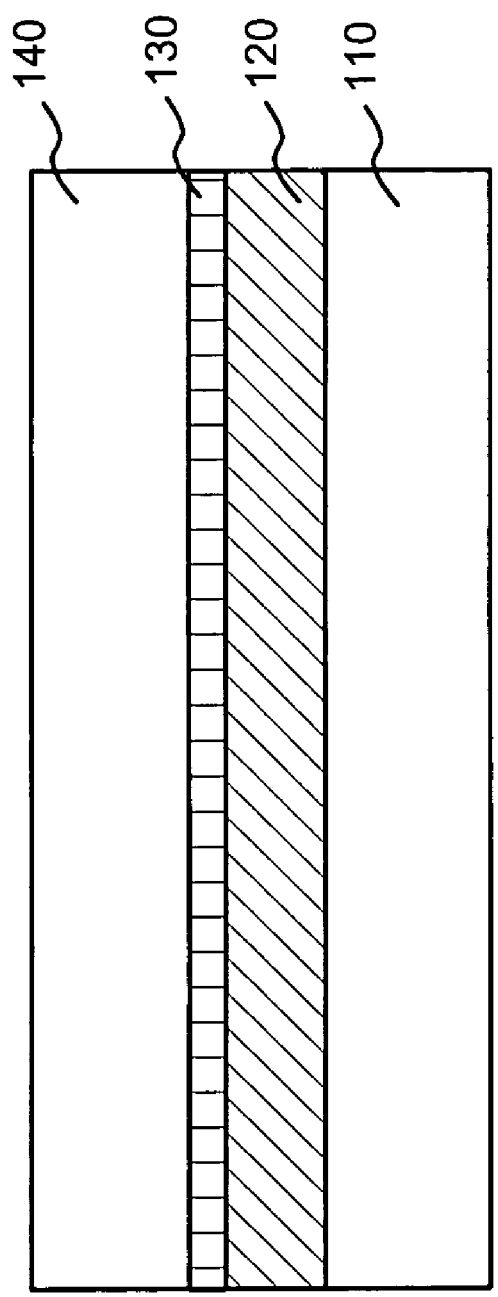
FIG. 1 is a cross-section illustrating exemplary layers that may be used for forming pillar structures in accordance with an embodiment of the present invention.

FIG. 1 illustrates an exemplary cross-sectional view of a semiconductor device 100 formed in accordance with an embodiment of the present invention. Referring to FIG. 1, semiconductor device 100 may include a silicon on insulator (SOI) structure that includes a silicon substrate 110 and a buried oxide layer 120 formed thereon. Buried oxide layer 120 may be formed on substrate 110 in a conventional manner. In an exemplary implementation, buried oxide layer 120 may include a silicon oxide, such as $SiO_2$, and may have a thickness ranging from about 500 Å to about 2000 Å.

A low resistance layer 130, such as a doped silicide or salicide, may be formed on buried oxide layer 120 to function as the source region or ground for semiconductor device 100, as described in more detail below. In an exemplary implementation, low resistance layer 130 may have a thickness ranging from about 100 Å to about 500 Å.

Silicon layer 140 may be formed over layer 130. Silicon layer 140 may include monocrystalline or polycrystalline silicon having a thickness ranging from about 200 Å to about 1000 Å. Silicon layer 140 may be used to form pillar structures, as described in more detail below.

In alternative implementations consistent with the present invention, substrate 110 and layer 140 may comprise other semiconducting materials, such as germanium, or combinations of semiconducting materials, such as silicon-germanium. Buried oxide layer 120 may also include other dielectric materials.

Figure 2:
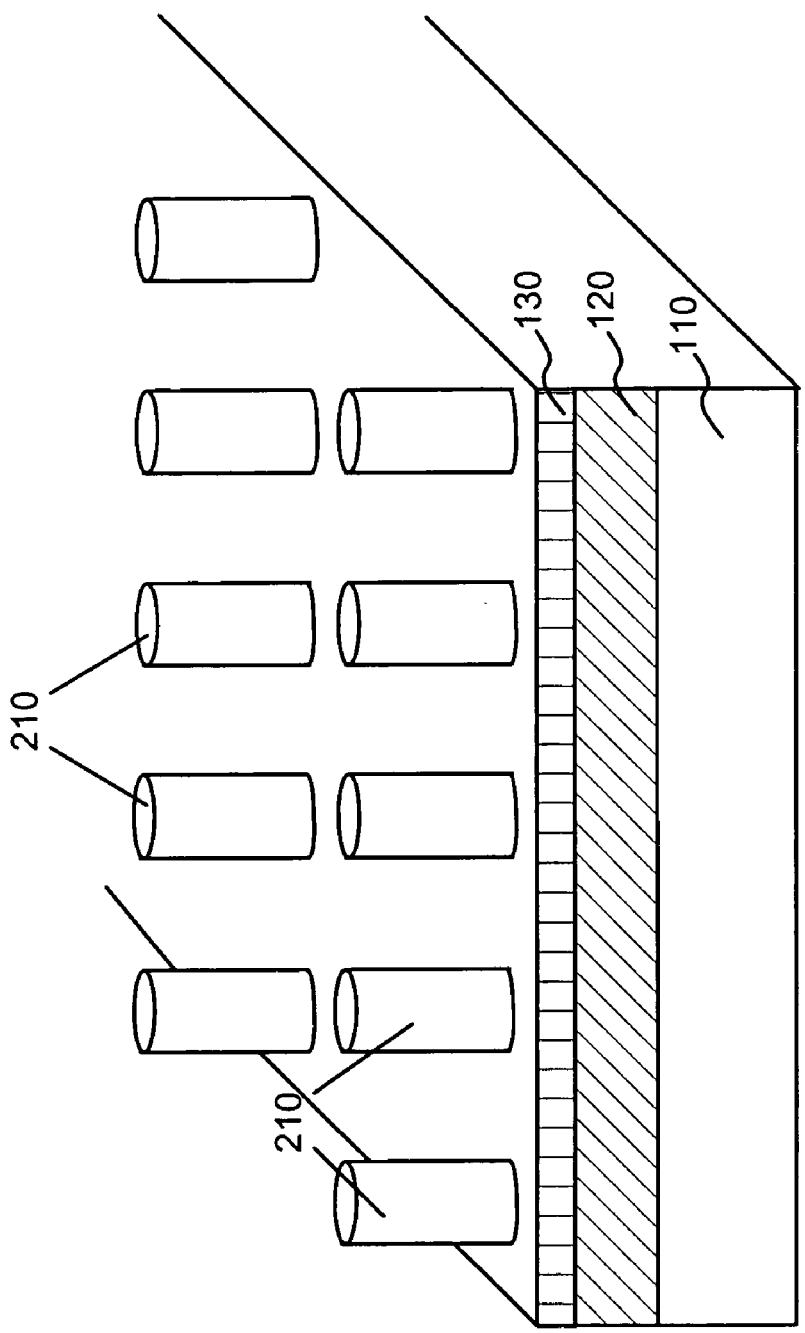
FIG. 2 is a perspective view illustrating a number of pillar structures formed in accordance with an exemplary embodiment of the present invention.

Silicon layer 140 may be patterned and etched to form structures 210, as illustrated in the perspective view of FIG. 2. For example, a photoresist material may be deposited over silicon layer 140 and patterned, followed by etching the portions of silicon layer 140 not covered by the photoresist to form a number of rows/columns of cylindrical, pillar-like structures 210, also referred to as pillar structures 210 or pillars 210. In an exemplary implementation, silicon layer 140 may be etched in a conventional manner, with the etching terminating on layer 130. The height of pillar structures 210 may range from about 100 Å to about 1000 Å and the width of pillar structures 210 may range from about 100 Å to about 1000 Å. In one implementation, the height and width of pillar structures 210 may be 500 Å and 200 Å, respectively. The pillar structures 210 may also be separated from each other in the lateral direction by about 100 nm to about 1000 nm. For simplicity, FIG. 2 illustrates two rows of pillar structures 210 with each row containing five pillar structures 210. It should be understood that additional rows/columns of pillar structures 210 may be formed.

Figure 3:
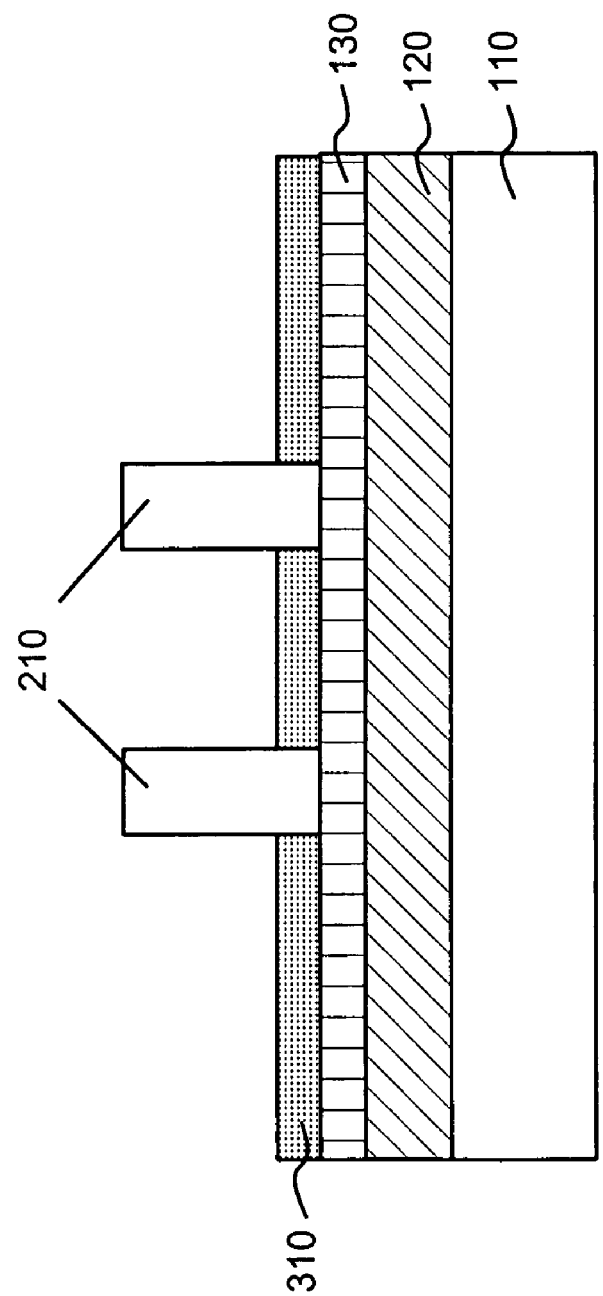
FIG. 3 is a cross-section illustrating the formation of an insulating layer on the device of FIG. 2 in accordance with an exemplary embodiment of the present invention.

After the formation of pillar structures 210, an insulating layer 310 may be formed on layer 130, as illustrated in FIG. 3. The insulating layer 310 may abut the base of the pillars 210. In an exemplary implementation, insulating layer 310 may comprise an oxide material, such as $SiO_2$ and the thickness of insulating layer 310 may range from about 100 Å to about 500 Å. Other insulating materials may also be used for insulating layer 310. The insulating layer 310 may electrically isolate one row of pillars 210 from another row.

Figure 4:
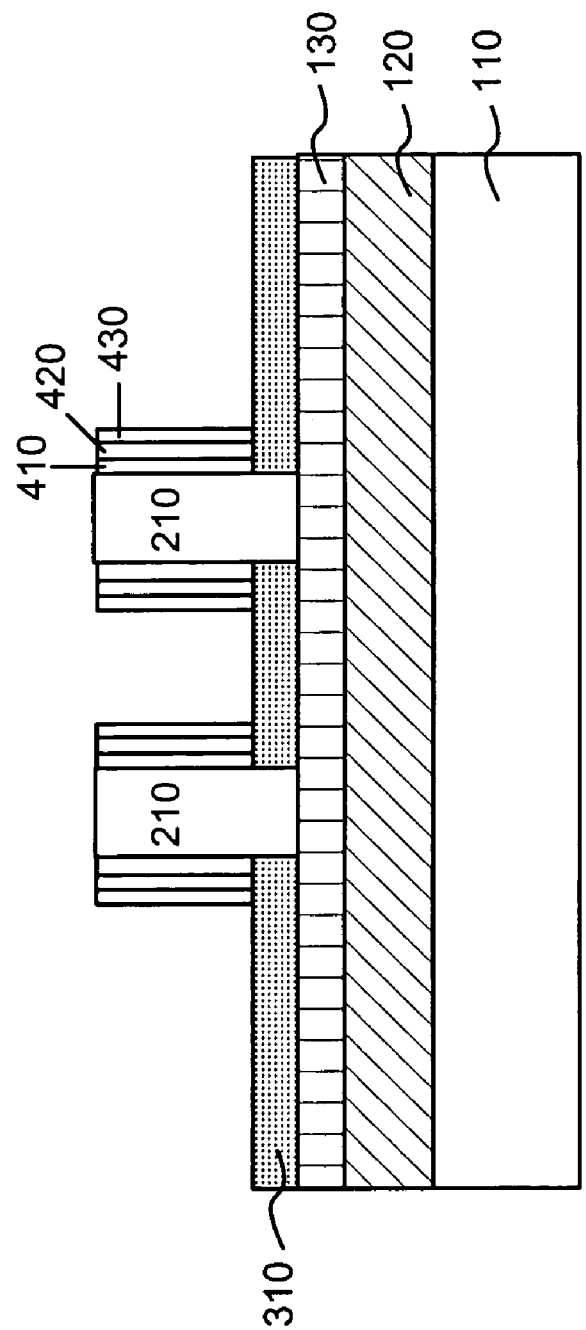
FIG. 4 is a cross-section illustrating the formation of dielectric layers around the pillar structures of FIG. 3 in accordance with an exemplary embodiment of the present invention.

A number of films may then be formed around pillars 210. In an exemplary implementation, oxide-nitride-oxide (ONO) dielectric films may be formed around pillars 210. For example, an oxide layer 410 may be formed around pillars 210 as illustrated in FIG. 4. In an exemplary implementation, oxide layer 410 may be deposited or thermally grown around pillars 210 to a thickness ranging from about 100 Å to about 500 Å. FIG. 4 illustrates a cross-section of two pillars 210 for simplicity. It should be understood that oxide layer 410 may be formed around each of the pillars 210 in a similar manner. It should also be understood that oxide layer 410 may be formed around all the exposed vertical surfaces of the pillars 210. In addition, in some implementations, the oxide layer 410 may be formed over the top surface. In such implementations, the top covering will be removed in subsequent processing, as described in more detail below.

Next, a nitride layer 420 may be formed around oxide layer 410, as illustrated in FIG. 4. In an exemplary implementation, nitride layer 420 may be deposited to a thickness ranging from about 100 Å to about 500 Å. Another oxide layer 430 may then be formed around nitride layer 420, as illustrated in FIG. 4. In an exemplary implementation, oxide layer 430 may be deposited or thermally grown to a thickness ranging from about 100 Å to about 500 Å. Layers 410–430 form an ONO charge storage dielectric for the subsequently formed memory device. More particularly, nitride layer 420 may function as a floating gate electrode and top oxide layer 430 may function as an inter-gate dielectric.

Figure 5:
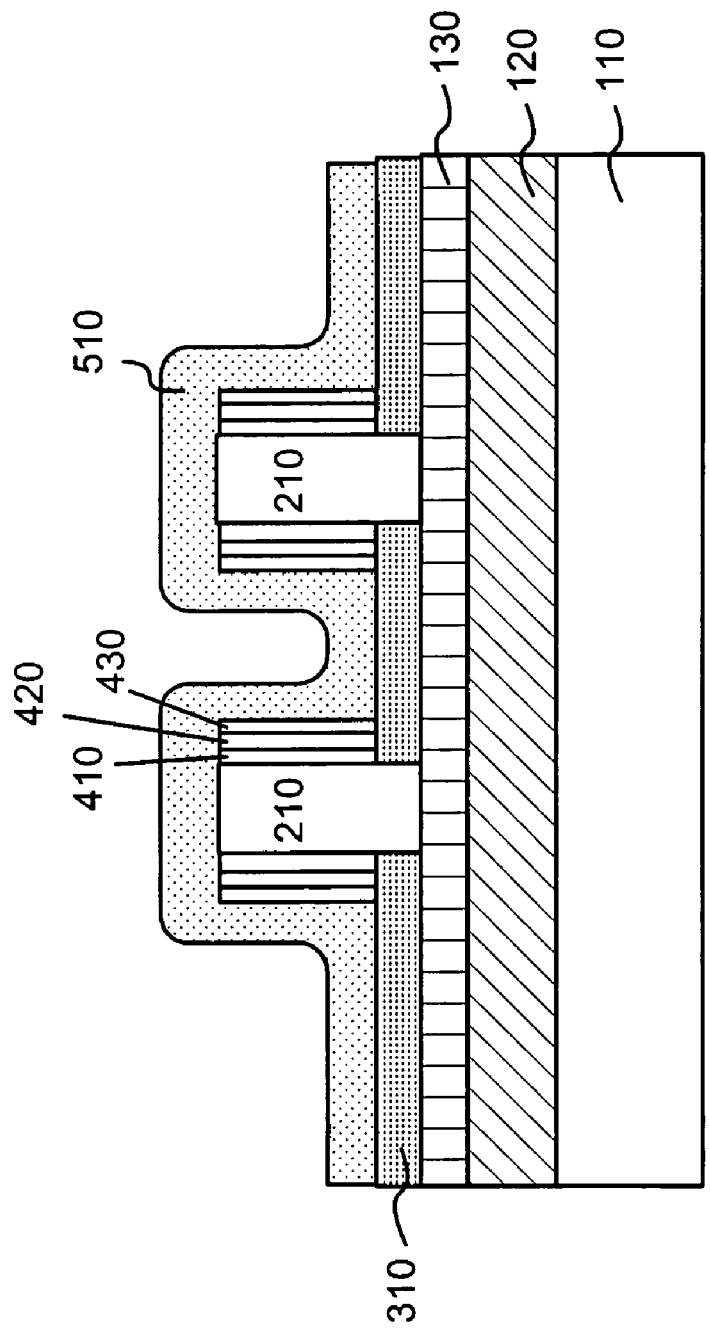
FIG. 5 is a cross-section illustrating the formation of control gate material on the device of FIG. 4 in accordance with an exemplary embodiment of the present invention.

A silicon layer 510 may then be formed over semiconductor device 100, as illustrated in FIG. 5. The silicon layer 510 may be used as gate material for a subsequently formed control gate electrode. In an exemplary implementation, the silicon layer 510 may comprise polysilicon deposited using conventional chemical vapor deposition (CVD) to a thickness ranging from about 100 Å to about 1000 Å. Alternatively, other semiconducting materials, such as germanium or combinations of silicon and germanium, or various metals may be used as the gate material.

Figure 6:
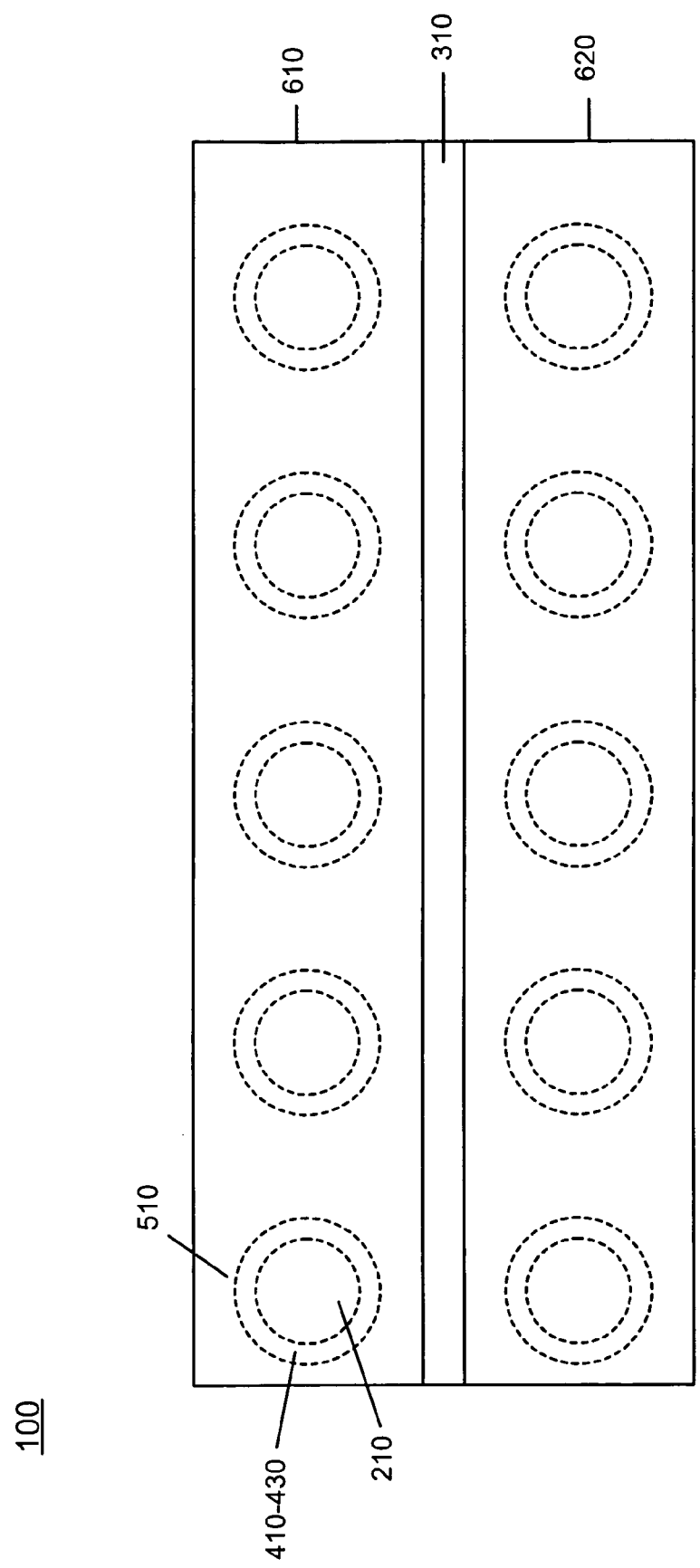
FIG. 6 is a top view illustrating the device of FIG. 5 after the control gate material has been deposited in accordance with an exemplary embodiment of the present invention.

Silicon layer 510 may then be patterned and etched, with the etching terminating on insulating layer 310. For example, FIG. 6 illustrates a top view of semiconductor device 100 consistent with the present invention after silicon layer 510 has been etched to form silicon rows, labeled 610 and 620. Referring to FIG. 6, rows 610 and 620 each include five pillars 210 (shown with dotted lines), ONO layers 410–430 (shown with dotted lines) surrounding the pillars 210 and silicon layer 510 surrounding the ONO layers 410–430. Insulating layer 310 electrically isolates rows 610 and 620 from each other. The silicon layer 510 shown in FIG. 6 may be substantially planar with the upper surface of pillars 210. In this implementation, the silicon layer 510 illustrated in FIG. 5 may be etched or planarized such that it is substantially planar with the upper surface of the pillars 210.

Figure 7:
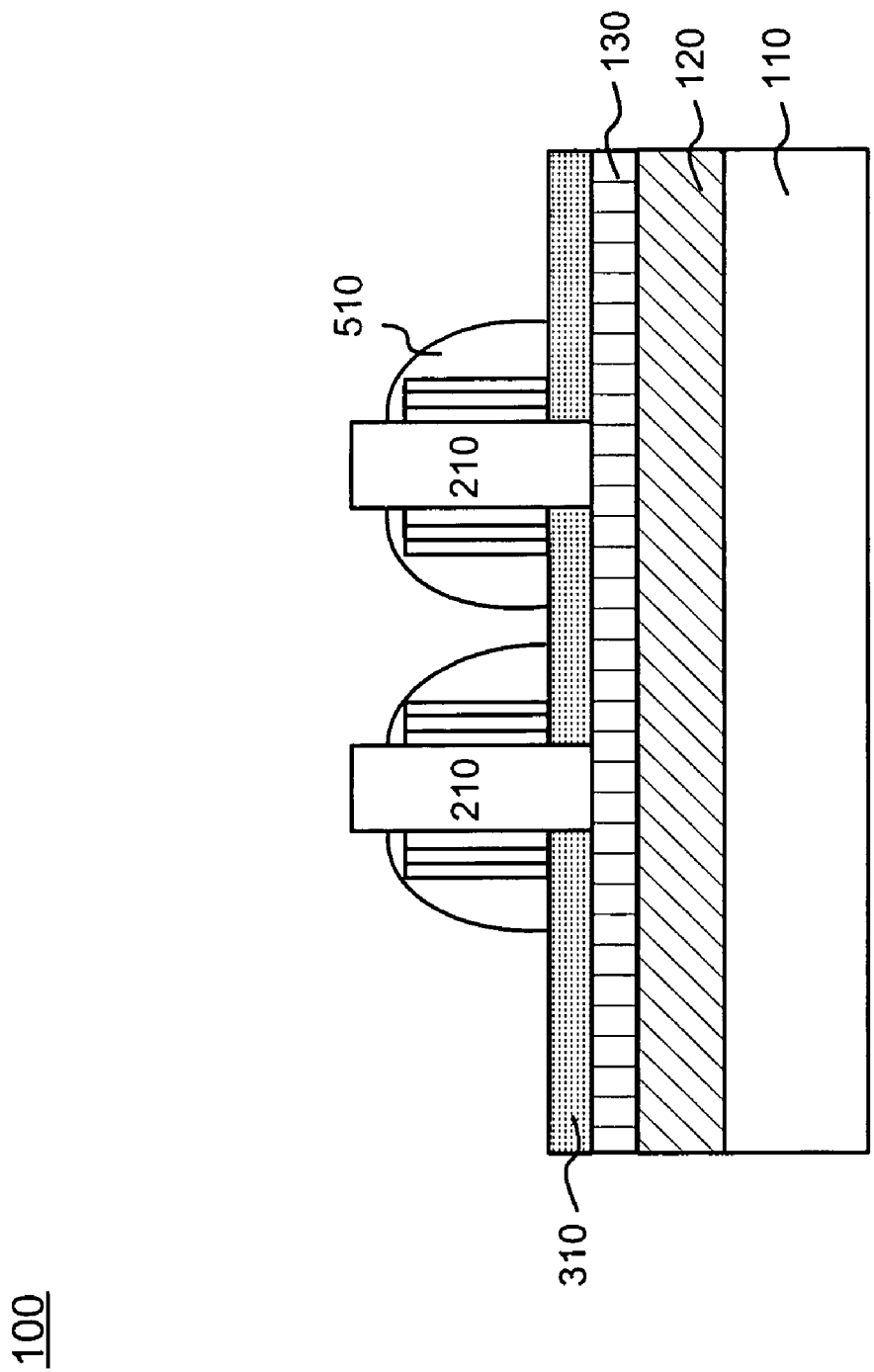
FIG. 7 is a cross section illustrating the etching of the control gate material of FIG. 5 in accordance with an exemplary embodiment of the present invention.

Silicon layer 510 may then be etched to expose an upper portion of pillars 210. For example, silicon layer 510 may be etched back to expose the top surface and upper portion of pillars 210, as illustrated in FIG. 7. In an exemplary implementation, approximately 100 Å to 500 Å of the upper portion of pillars 210 may be exposed after the etching. During the etching process, the portion of silicon layer 510 located between pillars 210 may be etched through to insulation layer 310, as illustrated in FIG. 7.

Figure 8:
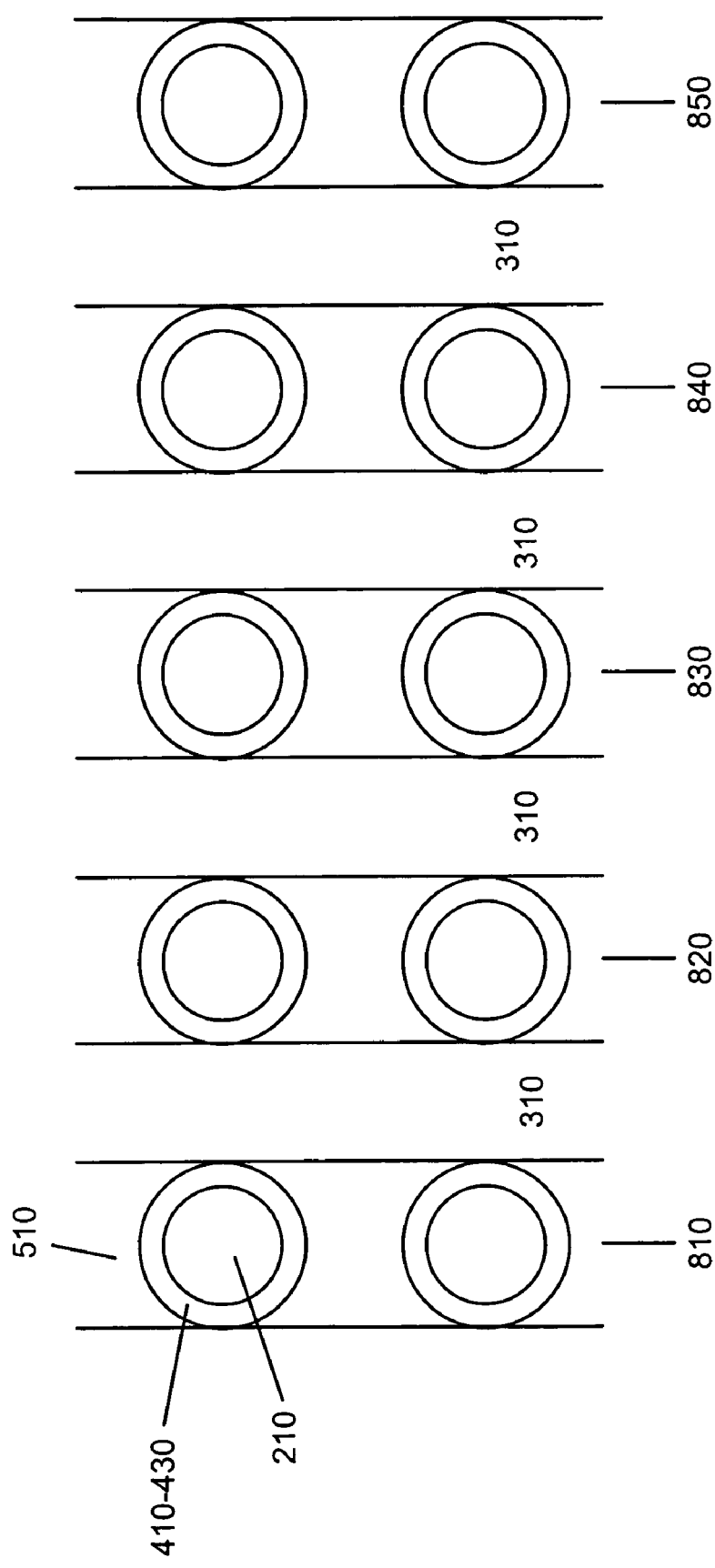
FIG. 8 is a top view illustrating the semiconductor device of FIG. 7 in accordance with an exemplary embodiment of the present invention.

FIG. 8 illustrates a top view of semiconductor device 100 after silicon layer has been etched to expose the upper portion of pillars 210. Referring to FIG. 8, semiconductor device 100 includes columns of pillars 210, labeled 810–850, surrounded by ONO layers 410–430 and polysilicon 510. Insulating layer 310 may separate columns 810–850.

Figure 9:
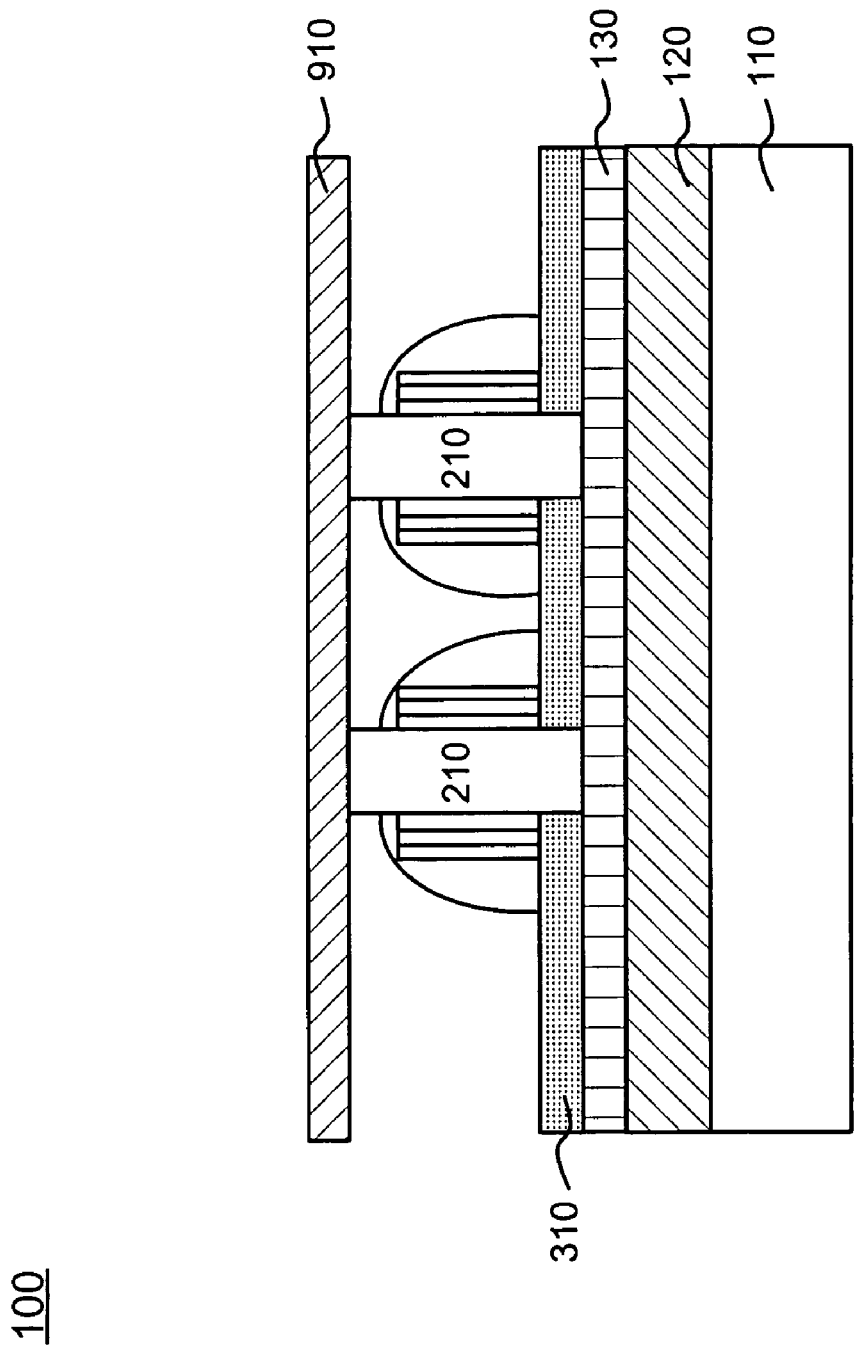
FIG. 9 is a cross-section illustrating the formation of a bitline on the device of FIG. 7 in accordance with an exemplary embodiment of the present invention.

Next, a metal, such as aluminum or copper may be deposited and patterned on semiconductor device 100 to form metal layer 910, as illustrated in FIG. 9. The thickness of metal layer 910 may range from about 200 Å to about 2000 Å. Referring to FIG. 9, metal layer 910 may function as a bitline for the semiconductor device 100. A bitline decoder (not shown) may be coupled to metal layer 910 to facilitate programming or reading out data from memory device 100.

Figure 10:
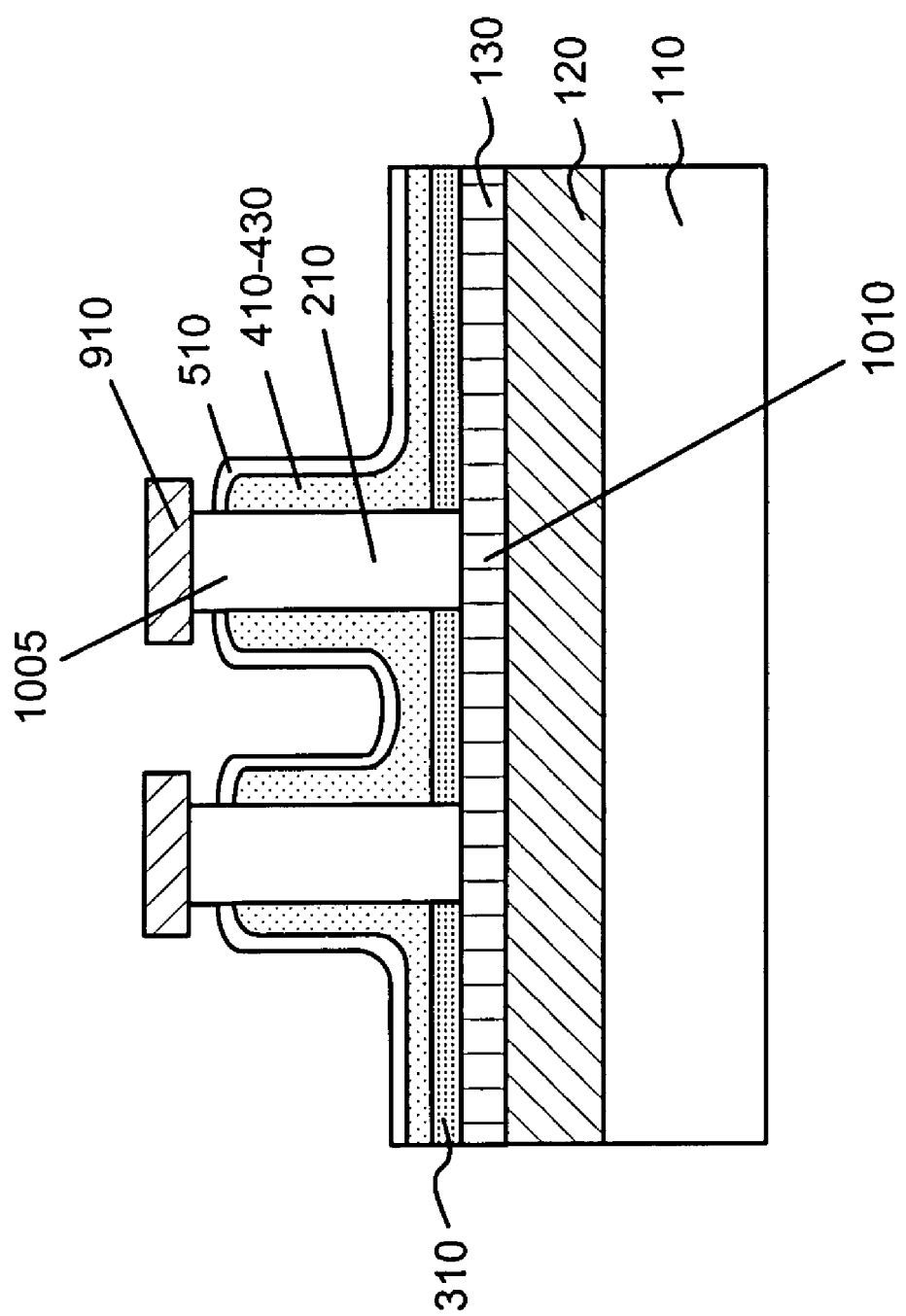
FIG. 10 is a cross-section of the device of FIG. 9 in the row direction in accordance with an exemplary embodiment of the present invention.

FIG. 10 illustrates an exemplary cross-sectional view of semiconductor device 100 in the row direction. Each of the pillars 210, surrounding ONO layers 410–430 and gate layer 510 may function as a memory cell in a memory array. Referring to FIG. 10, the upper portion of pillars 210, labeled 1005, may function as the drain region for a memory cell and the portion of layer 130 that abuts the lower portion of pillars 210, labeled 1010, may function as the source region for the memory cell in semiconductor device 100. Therefore, the channel of the memory cell is formed in the vertical pillar 210.

The source/drain regions 1010 and 1005 may be doped based on the particular end device requirements. For example, n-type or p-type impurities may be implanted in source/drain regions 1010 and 1005. For example, an n-type dopant, such as phosphorous, may be implanted at a dosage of about $1 \times 10^{19}$ atoms/cm$^2$ to about $1 \times 10^{20}$ atoms/cm$^2$ and an implantation energy of about 10 KeV to about 50 KeV. Alternatively, a p-type dopant, such as boron, may be implanted at similar dosages and implantation energies. The particular implantation dosages and energies may be selected based on the particular end device requirements. One of ordinary skill in this art would be able to optimize the source/drain implantation process based on the circuit requirements. In addition, source/drain regions 1010 and 1005 may be doped at an earlier step in the formation of semiconductor device 100, such as prior to formation of ONO layers 410. Further, various spacers and tilt angle implantation processes may be used to control the location of the source/drain junctions based on the particular circuit requirements. Activation annealing may then be performed to activate the source/drain regions 1010 and 1005.

The resulting semiconductor device 100 illustrated in FIG. 10 has a silicon-oxide-nitride-oxide-silicon (SONOS) structure. That is, semiconductor device 100 may include a silicon pillar structure 210 with ONO dielectric layers 410–430 and a silicon control gate 510 formed thereon. Pillar structures 210 function as a channel region or substrate electrode for the memory device and ONO layers 410–430 may function as a charge storage structure.

Semiconductor device 100 can operate as a non-volatile memory device, such as a NOR-type flash EEPROM. Programming may be accomplished by applying a bias of, for example, about 10 volts to control gate 510. That is, if the bias is applied to control gate 510, electrons may tunnel from the source/drain regions 1010 and 1005 into the floating gate electrode (e.g., nitride layer 420). Erasing may be accomplished by applying a bias of, for example, about 10 volts to control gate 510. During erasing, electrons may tunnel from the floating gate electrode (e.g., nitride layer 420) into the source/drain regions 1010 and 1005.

The semiconductor device 100 illustrated in FIGS. 9 and 10 may be used to form non-volatile memory array. For example, semiconductor device 100 in FIGS. 9 and 10 illustrates two memory cells that may each be used to store a single bit of information. According to an exemplary implementation, a number of memory cells similar to those illustrated in FIGS. 9 and 10 may be used to form a memory array. For example, a number of bitlines, such as bitline 910 illustrated in FIG. 9, may each be coupled to a row or column of pillars 210. A number of control gates, such as control gate 510 illustrated in FIG. 10, may each be electrically coupled to a column or row of memory cells that are offset from the bitlines 910 by 90° and function as word lines for the memory array. A bit line decoder (not shown) and word line decoder (not shown) may then be coupled to bit lines 910 and word lines 510, respectively. The bit line and word line decoders may then be used to facilitate programming or reading out data stored in each particular cell of the memory array. In this manner, a high density non-volatile memory array may be formed.

Thus, in accordance with the present invention, a flash memory device is formed using a number of vertical pillar structures. Advantageously, pillars 210 enables the channel for the memory device to be formed in a vertical structure, thereby helping the resulting memory device 100 achieve increased circuit density as compared to conventional flash memory devices. The present invention can also be easily integrated into conventional semiconductor fabrication processing.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) can be employed.

The present invention is applicable in the manufacturing of FinFET semiconductor devices and particularly in FinFET devices with design features of 100 nm and below. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail. In addition, while a series of processes for forming the semiconductor device of FIG. 5 has been described, it should be understood that the order of the process steps may be varied in other implementations consistent with the present invention.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

In addition, no element, act, or instruction used in the description of the present application should be construed as critical or essential to the invention unless explicitly described as such. Also, as used herein, the article "a" is intended to include one or more items. Where only one item is intended, the term "one" or similar language is used.

What is claimed is:

1. A memory device, comprising:
   a first conductive layer, wherein a portion of the first conductive layer acts as a source region for the memory device;
   a conductive structure having a cylindrical shape formed on the first conductive layer, the conductive structure having a first end and a second end opposite the first end, wherein the first end is disposed adjacent the portion of the first conductive layer that acts as the source region for the memory device and wherein the second end acts as a drain region for the memory device;

a plurality of dielectric layers formed around at least a portion of the conductive structure, wherein at least one of the dielectric layers acts as a floating gate electrode for the memory device; and a control gate formed over the plurality of dielectric layers, and wherein a top portion of the second end of the conductive structure does not contact any of the plurality of dielectric layers.

2. The memory device of claim 1, wherein the conductive structure has a thickness ranging from about 100 Å to about 1000 Å and a width ranging from about 100 Å to about 1000 Å.

3. The memory device of claim 1, further comprising:
an insulating layer formed on the first conductive layer, the insulating layer contacting the first end of the conductive structure.

4. The memory device of claim 1, wherein the plurality of dielectric layers comprises:
a first oxide layer formed around the conductive structure,
a nitride layer formed around the first oxide layer, and
a second oxide layer formed around the nitride layer, wherein the nitride layer acts as the floating gate electrode.

5. The memory device of claim 4, wherein the first oxide layer has a thickness ranging from about 100 Å to about 500 Å, the nitride layer has a thickness ranging from about 100 A to about 500 Å, and the second oxide layer has a thickness ranging from about 100 Å to about 500 Å.

6. The memory device of claim 1, wherein the plurality of dielectric layers has a combined thickness ranging from about 300 Å to about 1500 Å and functions as a charge storage structure.

7. The memory device of claim 1, wherein the control gate comprises polysilicon and has a thickness ranging about 100 Å to about 1000 Å.

8. The memory device of claim 1, further comprising:
a substrate; and
a buried oxide layer formed on the substrate, wherein the first conductive layer is formed on the buried oxide layer.

9. A memory device, comprising:
a substrate;
a first insulating layer formed on the substrate;
a conductive structure having a cylindrical shape formed over the first insulating layer, the conductive structure functioning as a channel region for the memory device;
a plurality of dielectric layers formed around a lower and a middle portion of the conductive structure and not around an upper most portion of the conductive structure, at least one of the dielectric layers functioning as a charge storage electrode for the memory device; and
a control gate formed over the plurality of dielectric layers, and wherein a top portion of the conductive structure does not contact any of the plurality of dielectric layers.

10. The memory device of claim 9, further comprising:
a conductive layer formed between the first insulating layer and the conductive structure, wherein a portion of the conductive layer adjacent the conductive structure acts as a source region for the memory device.

11. The memory device of claim 9, wherein the plurality of dielectric layers comprises:
a first oxide layer formed around at least a portion of the conductive structure,
a nitride layer formed around the first oxide layer, and
a second oxide layer formed around the nitride layer, wherein the nitride layer acts as the charge storage electrode.

12. The memory device of claim 9, wherein a first end of the conductive structure acts as a drain region for the memory device.

13. The memory device of claim 9, wherein the plurality of dielectric layers has a combined thickness ranging from about 300 Å to about 1500 Å.

14. The memory device of claim 10 further comprising:
a second insulating layer formed on the conductive layer, the second insulating layer contacting a lower most portion of the conductive structure.

15. A non-volatile memory array, comprising:
a first conductive layer formed on a substrate, wherein portions of the first conductive layer act as source regions for memory cells in the memory array;
a plurality of structures formed on the first conductive layer, wherein each of the plurality of structures has a cylindrical shape and functions as a channel region for one of the memory cells;
a plurality of dielectric layers formed around portions of each of the plurality of structures, wherein at least one of the plurality of dielectric layers functions as a charge storage electrode for one of the memory cells; and
at least one conductive layer formed over the plurality of dielectric layers for each of the memory cells; and
wherein a top portion of each of the plurality of structures does not contact any of the plurality of dielectric layers.

16. The non-volatile memory array of claim 15, wherein the plurality of dielectric layers comprises:
a first oxide layer,
a nitride layer formed around the first oxide layer, and
a second oxide layer formed around the nitride layer, wherein the nitride layer functions as the charge storage electrode.

17. The non-volatile memory array of claim 15, further comprising:
a plurality of bitlines, wherein each of the plurality of bitlines contacts a number of the plurality of structures.

18. The non-volatile memory array of claim 17, wherein the at least one conductive layer comprises a plurality of conductive layers, wherein each of the conductive layers contacts a top one of the plurality of dielectric layers associated with a group of memory cells and functions as a word line for the non-volatile memory array.

19. The non-volatile memory array of claim 15, wherein each of the plurality of structures functions as a drain region for one of the memory cells.

20. The non-volatile memory array of claim 15, further comprising:
an insulating layer formed on the first conductive layer, the insulating layer contacting a lower portion of the plurality of structures.

* * * * *